Figure 4:
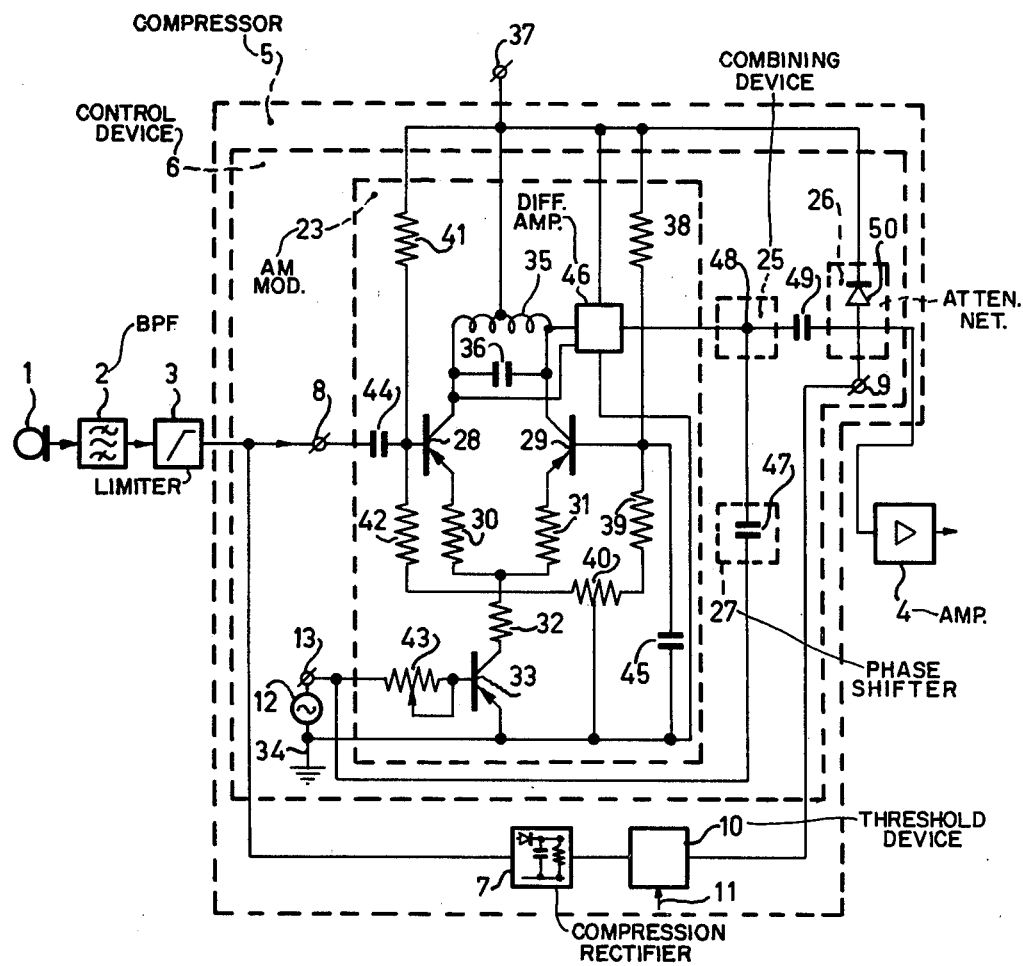

United States Patent [19]

Meewezen

[11] 4,103,239
[45] Jul. 25, 1978

[54] COMPRESSOR FOR BOTH SPEECH AND CARRIER SIGNALS

[75] Inventor: Willem Douwe Meewezen, Hilversum, Netherlands

[73] Assignee: U.S. Philips Corporation, New York, N.Y.

[21] Appl. No.: 792,647

[22] Filed: May 2, 1977

Related U.S. Application Data

[63] Continuation of Ser. No. 616,628, Sep. 25, 1975, abandoned.

[30] Foreign Application Priority Data

Oct. 1, 1974 [NL] Netherlands .......................... 7412916

[51] Int. Cl.$^2$ ............................................. H04B 1/04
[52] U.S. Cl. ...................................... 325/144; 325/62; 333/14
[58] Field of Search ...................... 325/49, 50, 59, 62, 325/144, 137, 138; 333/14; 179/18 AV

[56] References Cited

U.S. PATENT DOCUMENTS

| 3,003,036 | 10/1961 | Greefkes | 325/62 |
| 3,024,313 | 3/1962 | Ensink et al. | 325/50 |
| 3,112,462 | 11/1963 | De Jager et al. | 333/14 |
| 3,274,492 | 9/1966 | Van Kessel et al. | 325/50 |

Primary Examiner—Robert L. Griffin
Assistant Examiner—Jin F. Ng
Attorney, Agent, or Firm—Frank R. Trifari; Henry I. Steckler

[57] ABSTRACT

A transmitter has a dynamic compressor provided with a dynamic control device and a compression rectifier fed by the signals to be transmitted, whose output signal controls the dynamic control device via a threshold device and also comprises a signal source which supplies a pilot signal, the signal to be transmitted and the pilot signal being fed to the input of the dynamic control device.

5 Claims, 15 Drawing Figures

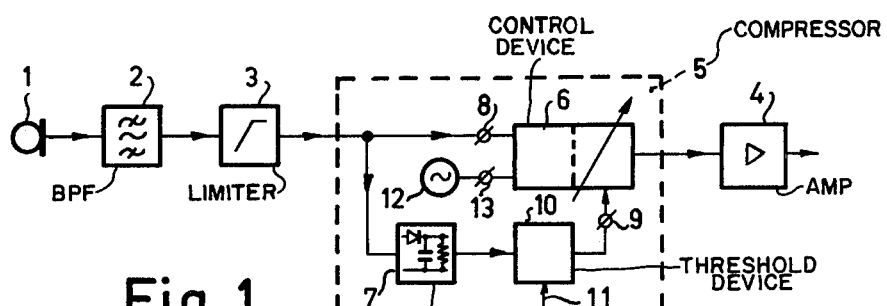
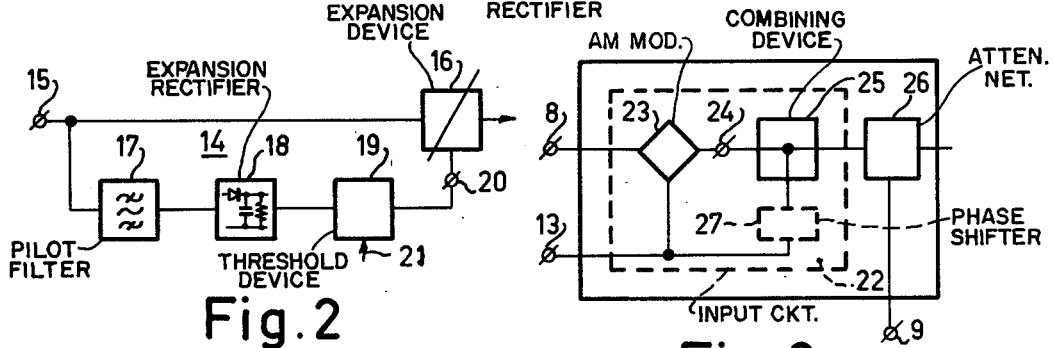
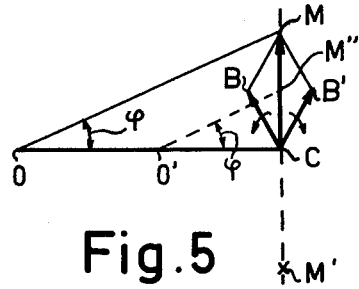
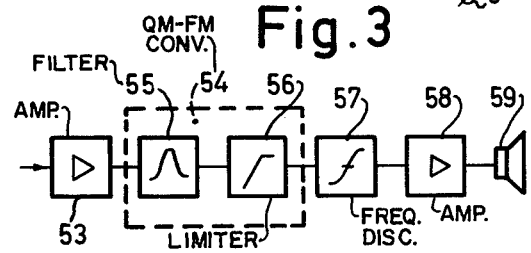
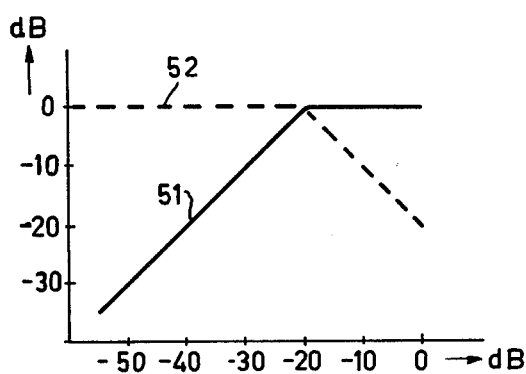
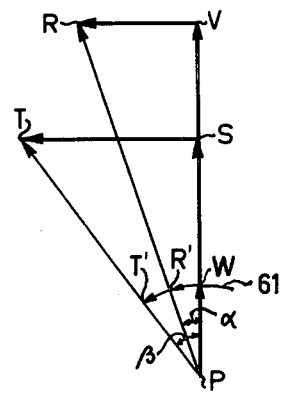

COMPRESSOR FOR BOTH SPEECH AND CARRIER SIGNALS

This is a continuation, of application Ser. No. 616,628, filed Sept. 25, 1975 now abandoned.

The invention relates to a signal transmission system comprises a transmitter having a dynamic compressor and a receiver having a dynamic expander, the dynamic compressor being provided with a first dynamic control device and a compression rectifier fed by the signals to be transmitted, whose output signal controls the dynamic control device via a first threshold device and which also comprises a signal source which supplies a pilot signal, the signal to be transmitted and the pilot signal being fed to the input of the dynamic control device whilst the dynamic expander comprises a filter.

Such transmission systems provided with a compander system with pilot signal are known inter alia from the article: "Compander with a high degree of compression of speech level variations" by J. A. Greefkes, P. J. van Gerwen and F. de Jager published in Philips Technical Review, Volume 26, pages 215/225, No. 8/9 1965.

These transmission systems provided with companders are used in particular in radio telephone systems, such as telephone transmission via satellites, whereby a considerable improvement in the signal/noise ratio is obtained.

In particular, the pilot signal in the aforementioned signal transmission system serves on the one hand to eliminate the influence on the signal transmission of spontaneous attenuation variations on the transmission channel, and on the other hand, amplitude distortion due to noise to substantially reduced because of the narrow band of the pilot signal.

However, these known transmission systems have the drawback that they are comparatively complicated.

The invention offsets this drawback and has for its object to provide another concept which enables a simplification of the construction whilst retaining the said advantages.

The system according to the invention is characterized in that the dynamic control device which is part of the compressor comprises an input circuit having an amplitude modulator which is connected to a carrier generator, the signal to be transmitted being fed to this modulator for generating a double-sideband signal with suppressed carrier, the input circuit comprising a combination device connected to the modulator output for combining the double-sideband modulated signal and the pilot signal, the carrier signal generator forming the said signal for supplying the carrier signal to the combination device as a pilot signal, the filter present at the receiving end being tuned to the carrier signal frequency.

By using the method according to the invention it is ensured that the modulation index or degree of modulation is not affected by the compression, which permits a simple construction of the transmission system, as will be further explained hereinafter.

The invention and its advantages will now be further explained with reference to the following Figures in which like parts in the different Figures are designated by the same references and in which:

FIG. 1 shows the circuit diagram of a transmitter for use in a signal transmission system, which transmitter is provided with a compressor with pilot, FIG. 2 shows the circuit diagram of a dynamic expander for use in a receiver in a signal transmission system provided with a transmitter as shown in FIG. 1, FIG. 3 shows a circuit diagram of a dynamic compressor for use in a transmitter of a signal transmission system according to the invention, FIG. 4 shows an embodiment of the circuit diagram of the transmitter which is schematically shown in FIG. 1 in which the dynamic control device shown in FIG. 3 is shown in more detail for signals to be transmitted in quadrature-modulated form.

FIG. 5 shows a vector diagram of the signals to be transmitted in quadrature modulated form.

Figure 9A:
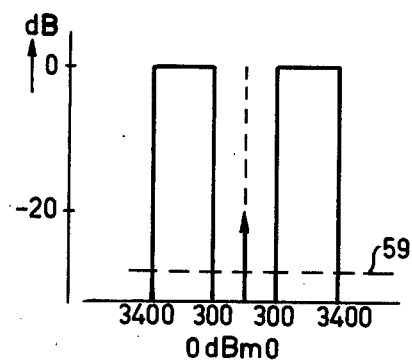
Figure 9B:
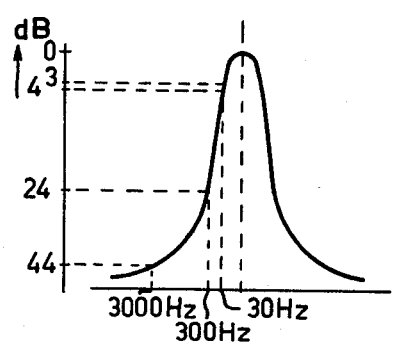
Figure 9C:
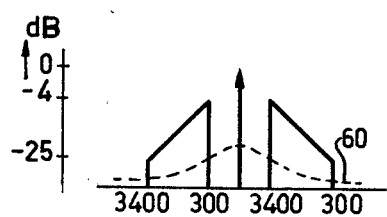
Figure 13:
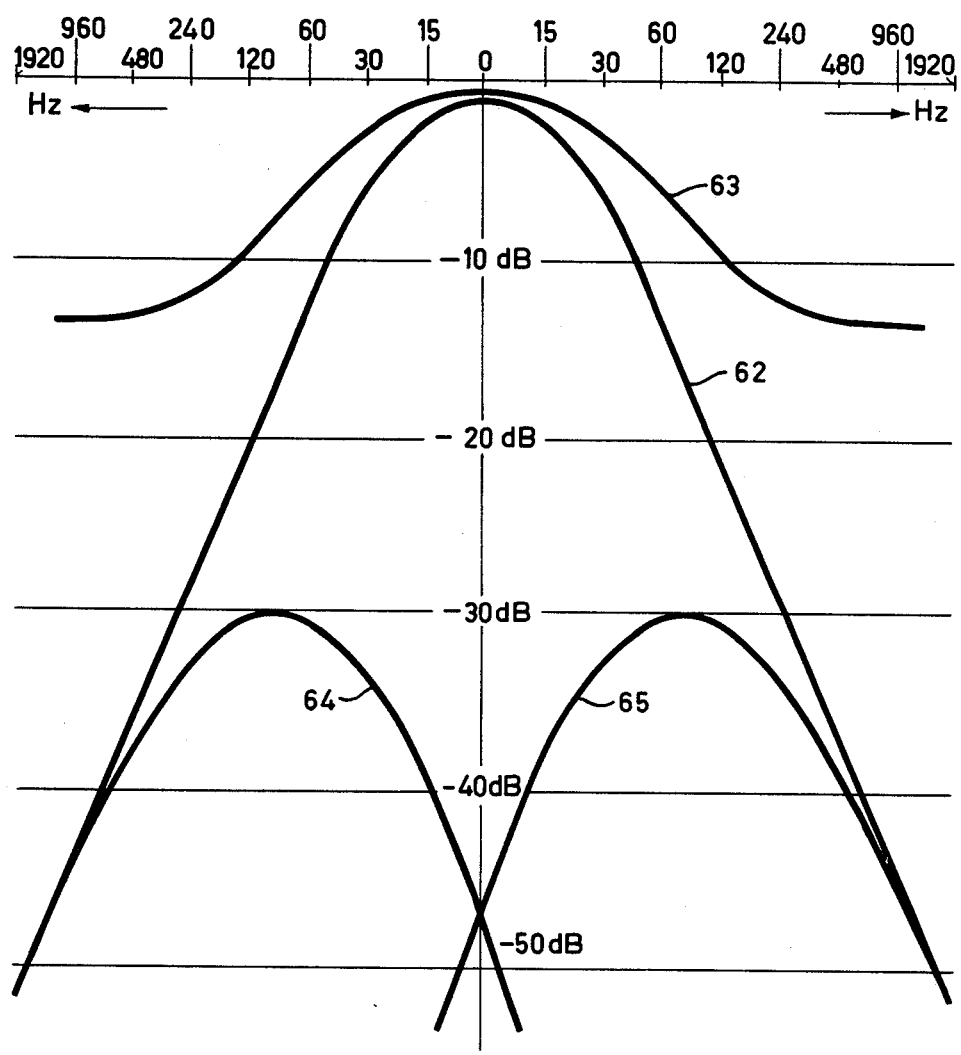

FIG. 6 shows a possible compression characteristic of a compressor used in the embodiment of the transmitter shown in FIG. 4, FIGS. 7a to 7d show diagrams explaining the operation of the compression of the signals to be transmitted, FIG. 8 shows a circuit diagram of part of a receiver for cooperation with the transmitter shown in FIG. 4, FIG. 9b shows a filter characteristic of the filter used in the receiver shown in FIG. 8, the FIGS. 9a and 9c showing associated signals, The FIGS. 10a to 10d show signal shapes obtained after filtering with the filter whose filter characteristic is shown in a FIG. 9b, FIG. 11 is a diagram to explain the operation of the limiter which is part of the receiver shown in FIG. 8, the FIGS. 12a to 12d shows signal shapes obtained after limiting in the limiter, which is part of the receiver shown in FIG. 8, FIG. 13 shows another filter characteristic of the filter used in the receiver shown in FIG. 8.

The transmitter shown in FIG. 1 is part of a signal transmission system which is intended for the transmission of speech signals. In this transmitter the speed signals derived from a microphone 1 are fed to an amplitude limiter 3 through a speed filter 2 having a passband of 300–3400 Hz. After having been amplified in an amplifier 4, the speech signals which are limited in amplitude in the said limiter are transmitted. For dynamic compression purposes a dynamic compressor 5 is arranged between limiter 3 and amplifier 4, which compressor is provided with a dynamic control device 6 and a compression rectifier 7, and includes a low-pass filter of a cut-off frequency of about 25 Hz which is associated with the compression rectifier 7. The speech signals to be transmitted which are delivered by the limiter 3 are supplied to an input 8 of the dynamic control device 6 and also to the compression rectifier 7. In this construction the compression rectifier 7 is formed by an envelope detector whilst the dynamic control device 6 comprises an adjustable attenuation network which is controlled by a control voltage and in which at least one rectifier cell is used as a variable resistance. The control voltage supplied to the control input 9 of the dynamic control device 6 is derived from a first threshold device 10 which is connected to the compression rectifier 7 and to which a fixed threshold voltage is supplied via input 11 in a manner not further explained.

The dynamic compressor 5 is further provided with a signal source 12 for generating a pilot signal which is applied to an input 13 of the dynamic control device 6.

The dynamic expander 14, shown in FIG. 2, of the receiver comprises a dynamic control device 16 connected to a signal input 15 and whose dynamic control characteristic is the inverse of the control characteristic of the dynamic control device 6 of the transmitter according to FIG. 1. For the selection of the transmitted pilot signal which is compressed in accordance with the transmitted speech signal the dynamic expander 14 comprises a filter 17 whose output signal is converted by means of an expansion rectifier 18, which is provided with a low-pass filter having a cut-off frequency of about 25 Hz, and a second threshold device 19 into a control voltage which is fed to the control input 20 of the dynamic control device 16 for controlling this control device. The fixed threshold voltage of the threshold device 19 is determined by a reference voltage source connected to input 21, which reference voltage source is not shown.

A favourable and in every respect advantageous signal transmission system of the type described so far is obtained if according to the invention the dynamic control device 6, which is shown further in more detail in FIG. 3 and is included in the compressor 5 shown in FIG. 1 comprises an input circuit 22 with an amplitude modulator 23, connected to a carrier generator to which the signal to be transmitted is supplied for generating a double sideband signal with suppressed carrier, the input circuit 22 further comprising a combination device 25 connected to the input 24 of the modulator 23 for combining the double-sideband modulated signal and the pilot signal, whilst the carrier signal generator forms said signal source 12, shown in FIG. 1, for supplying the carrier signal as the pilot signal to the combination device 25. Furthermore, the filter 17, shown in FIG. 2, which is incorporated at the receiver end, is tuned to the carrier signal frequency. Reference 26 in FIG. 3 designates the adjustable attenuation network 26 of the dynamic control device.

In the embodiment described sofar of the dynamic compressor 6, shown in FIG. 3, the signal supplied to the attenuation network 26 is composed of a carrier signal having a constant amplitude to which a double sideband signal is added whose strength is proportioned to the signal level of the signals to be transmitted so that an amplitude-modulated signal is obtained whose degree of modulation varies with the signal strength of the signal to be transmitted. As in the attenuation network 26 the carrier signal and the sidebands are affected to the same degree by the control voltage supplied to control input 9, the important advantage is obtained that the degree of modulation is not affected by the dynamic compression.

The dynamic expander 14 shown in FIG. 2 for use in a receiver can be used without any objection to expand the double-sideband signal of the composite signal provided the filter 17 is tuned to the carrier signal frequency.

In the above explanation of the dynamic compressor 6, the signal supplied to the attenuation network 26 of the dynamic control device 6 shown in FIG. 3 is an amplitude-modulated signal. For certain applications such as, for example, in satellite communication systems in which a high degree of modulation with a limited bandwidth is advantageous to save energy, the signal supplied to the attenuation network 26 may be a quadrature-modulated signal. Such a quadrature-modulated signal is obtained in a simple manner by means of a mutual 90° phase shift of the signals supplied to combination device 25 which may, for example, be achieved by adding the carrier signal to combination device 25 through a 90° phase shifting network 27 which is shown in FIG. 3 by dashed lines.

In FIG. 4, the modulator enclosed within dashed lines comprises two transistors 28 and 29 whose emitters are interconnected via identical resistors 30 and 31 and connected via a common resistor 32 to the collector of a transistor 33 whose emitter is connected to earth 34. The collectors of the transistors 28 and 29 are interconnected via a circuit tuned to the carrier signal frequency, which circuit is formed by the parallel circuit of a coil 35 having a center tap and a capacitor 36, the supply voltage being fed to the center tap of the coil 34 through a power supply terminal 37. The bases of the transistors 28 and 29 are connected to voltage dividing circuits which are connected between the power supply terminal 37 and earth 34 and which are formed by resistors 38, 39 and a part of resistor 40 and resistors 41, 42 and the remaining part of the resistor 40, respectively, the bias direct currents of the transistors 28 and 29 being adjusted symmetrically by means of the resistor 40. The carrier generator 12 is connected to the base of transistor 33 through the variable resistor 43. This ensures that the currents flowing through the two transistors vary in the rhythm of the carrier frequency.

The speech signal to be transmitted which is supplied by the amplitude limiter 3 is applied to the base of transistor 28 through a coupling capacitor 44 whilst for a.c. voltage signals the base of transistor 29 is connected to earth through capacitor 45.

The current distribution between the transistors 28 and 29 is determined by the instantaneous value of the speech signal to be transmitted which is supplied to the base of transistor 28. The currents through the two transistors 28 and 29 will be equally large owing to the symmetrical DC biassing of these transistors 28 and 29 if no speech signal is supplied or if the instantaneous value of the speech signal is zero volts. These equally large currents which, however, flow in opposite senses through the two halves of the coil 35 produce a voltage of zero volts across the coil, which means that no input signal is supplied to a known differential amplifier 46 which is connected to a circuit formed by the coil 35 and the capacitor 36, so that the output signal of the differential amplifier does not contain a carrier signal. To obtain power the differential amplifier 46 is connected between the supply voltage terminal 37 and earth 34.

With an instantaneous value of the speech signal to be transmitted which deviates from zero, a current distribution proportional to this value is obtained between the transistors 28 and 29 and a correspondingly high voltage is produced across coil 35, so that, via the differential amplifier 46 a double-sideband-modulated signal with suppressed carrier is taken from the circuit formed by the coil 35 and the capacitor 36 and is supplied to the combination device 25. The maximum strength of this double-sideband modulated signal is adjusted by means of the variable resistor 43.

The carrier signal delivered by the carrier signal generator 12 is also supplied to the combination device 25 which is constructed as a node 48, via the 90° phase shifting network 27 which is formed by a capacitor 47.

FIG. 5 shows for a single sinusoidal signal of a given amplitude value of the speech signals the sideband vectors CB and CB' and which sideband signals by the differential amplifier are supplied to the combination device. The sum factor which is representative of this double-sideband modulated signal is shown by CM and varies with time along the straight line MM'. The carrier signal supplied to the combination device 25 is represented in FIG. 5 by the vector OC and is perpendicular to the sum vector CM. The composite signal obtained in this way is a quadrature-modulated signal, whose angle φ is representative of the instantaneous modulation depth, and which varies with the signal strength.

As is known, a quadrature-modulated signal has the important advantage that a large modulation index does not introduce extra sidebands, which enables the transmission of a signal with a relatively narrow band and the use of a very large modulation index, for example $m = 10$, whereby a proper signal-noise ratio is obtained in the transmission of the signal.

The quadrature modulated speech signal obtained at the output of the combination device 25 (FIG. 4) is supplied, via coupling capacitor 49, to the adjustable attenuation network 26 which is formed by one single diode 50. In this network 26 a compressed quadrature-modulated signal is obtained at the output by varying the resistance of the diode 50 under the control of the control voltage supplied to the control input 9. Because in this situation not only the two sidebands but also the carrier signal are compressed to the same degree, as is illustrated in FIG. 5 by reducing the vector CM to CM" and the vector OC to O'C, the angle φ remains constant in these Figures which means that the modulation index is not affected by the compression.

In a preferred embodiment of the system according to the invention in which the receiver can be realized in a particularly simple manner, as will be explained hereinafter, the dynamic compressor 5 shown in FIG. 4, has the control characteristic shown in FIG. 6. In this characteristic the level of the compressor output signal is shown as a function of the level of the compressor input signal in which particularly the solid line 51 shows the relation between the sideband signal level and the level of the speech signal delivered by the limiter 3, the dashed line 52 showing the relation between the carrier signal level and the said speech signal level delivered by the limiter 3. As appears from this Figure, the sideband signals for speech signals below a level of −20 dBmO are not compressed, but for speech signals above −20 dBmO they are compressed to an output signal level (of a level) of 0 dB, chosen by way of example. In this embodiment the strength of the carrier signal delivered by the carrier generator 12 has also been chosen to be 0 dBmO, which means that for speech signal levels above −20dBmO the carrier signal is compressed in proportion to the degree of compression of the sideband signals, as aforementioned.

To illustrate this principle of compression FIGS. 7a to 7d show the correlation between the levels of the carrier and sideband signals obtained after compression for various strengths of the speech signals delivered to the compressor.

Figure 7:
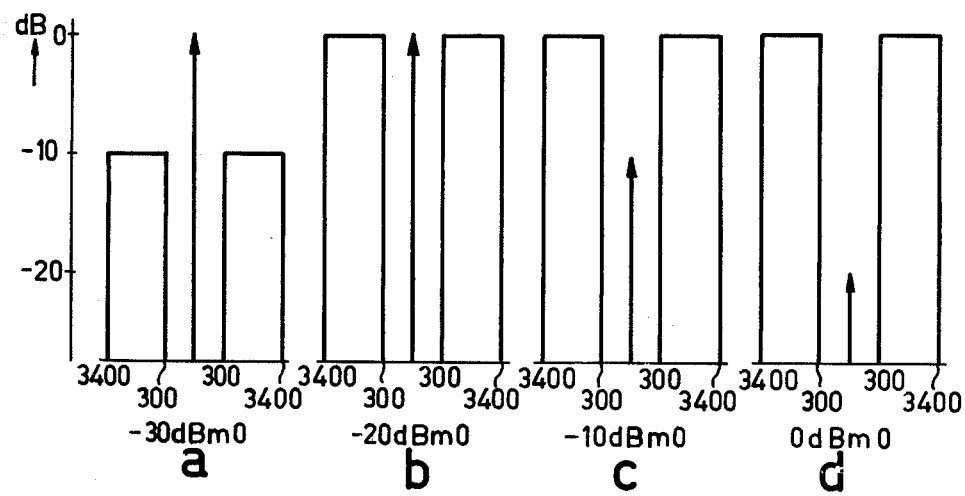
Figure 10:
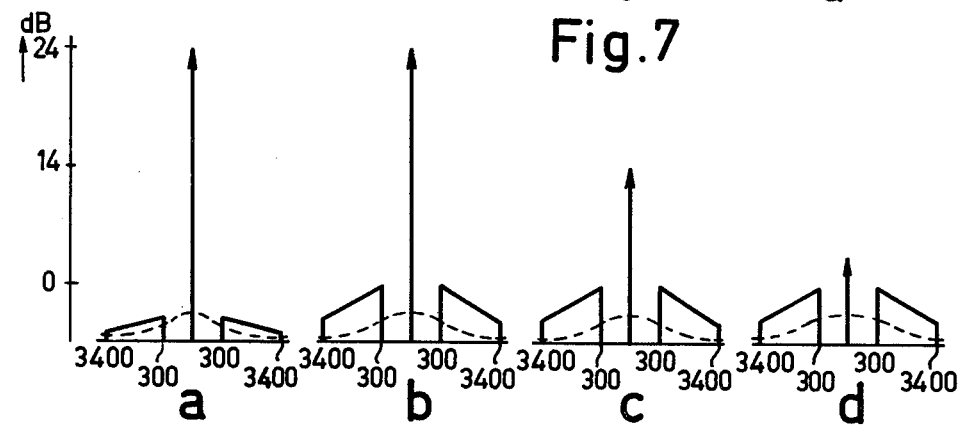
Figure 12:
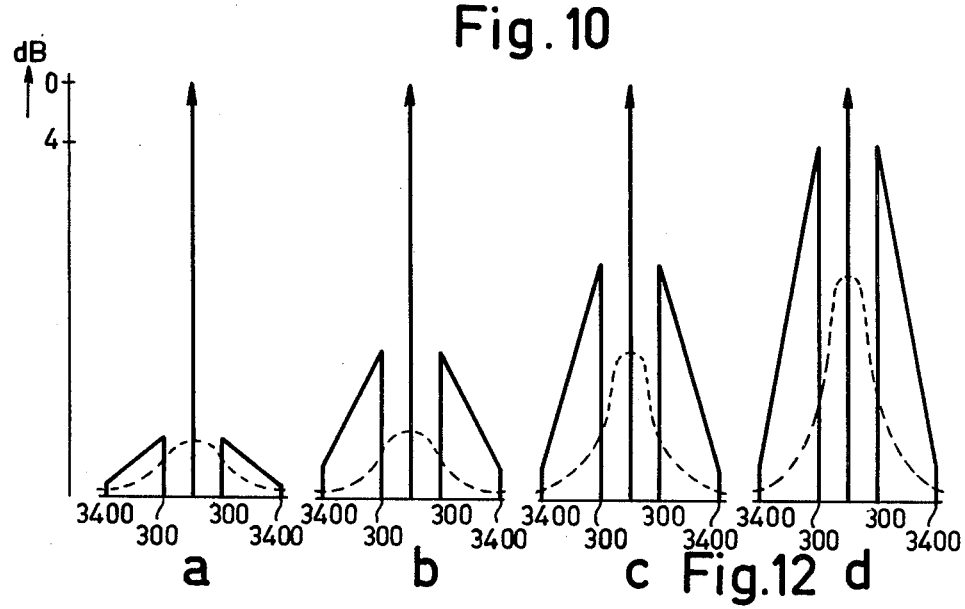

For a received speech signal of −30dBmO. FIG. 7a shows a non-compressed sideband signal level of −10dB with respect to a carrier signal level which is also not compressed and which, in this embodiment has been set at, for example, 0 dB. At a speech signal level of −20 dBmO at the input of the compressor, FIG. 7b shows a sideband signal level of 0 dB and a carrier signal level of 0 dB at the output of the compressor 5. A speech signal level of −10 dBmO at the input of the compressor 5 results in a signal level of the sidebands which is compressed to 0dB and a signal level of the carrier signal which is compressed to −10dB at the output of the compressor 5. FIG. 7d shows at an input speech signal level of 0 dBmO a sideband signal level of 0 dB and a carrier signal level of −20 dB which is compressed proportionally therewith.

After having been amplified in amplifier 4 these signals are supplied to a receiver, shown in FIG. 8. As the Figure shows this receiver is of a very simple construction. In particular, after having been transposed in frequency in a manner not shown, a signal received is, in this sequence, amplified in an amplifier 53, converted from a QM-modulated signal into an FM-modulated signal in a QM-FM modulation converter 54, which comprises a filter 55 and a limiter 56, demodulated in a frequency discriminator 57 and supplied to a reproducing device 59 via an amplifier 58. The exceptional simplicity of the receiver is the result of the fact that the modulation converter 54 also effects the dynamic expansion in a manner described hereinafter.

In particular the filter 55 is constructed for this purpose as a single filter which has a bandwidth of about 50Hz and which is tuned to the carrier frequency. FIG. 9b shows the characteristic of this filter 55 in more detail.

As is known such a single filter has an attenuation of 6 dB per octave, outside the 3 dB attenuation points. The bandwidth of 50 Hz causes the attenuation to be about 4 dB for a 30 Hz deviation of the carrier frequency, the attenuation to be about 24 dB for a 300 Hz frequency deviation and the attenuation to be about 44 dB for a frequency deviation of 3000 Hz.

If the signal combination received, shown in FIG. 9a, which corresponds to the transmitted signal combination, shown in FIG. 7d, is supplied to this filter, the carrier signal is passed unattenuated as shown in FIG. 9c, whilst sideband signals having a signal frequency of 300 Hz are attenuated 24 dB and thereafter by 6 dB/octave, resulting in an attenuation of 44 dB at a signal frequency of 3000 Hz. For this signal combination this causes the carrier signal level to extend 4 dB above the sideband signal levels which have a frequency of 300 Hz and to extend 24 dB above the sideband signal levels which have a frequency of 3000 Hz, as shown in FIG. 9c.

In FIGS. 9a and 9c the curves 59 and 60 respectively show the level of the noise signal received on the transmission path.

The other signal combinations shown in FIGS. 7a to 7d show, after having been transmitted and filtered by the filter 55, the shapes shown in FIGS. 10a to 10d, whilst the level of noise received on the transmission path is indicated in FIGS. 10a to 10d by dashed lines.

From the above it will be clear that the signal which appears at the input of the filter 55 is a quasi FM signal having a modulation index of approximately one, which means that, approximately the comprising of sidebands of the first order only corresponds to a normal FM signal having this same modulation index.

These signals are fed to the limiter 56. The operation of this limiter will be further explained with reference to FIG. 11. This Figure shows a vector representation of a first signal combination in which the vector PV is representative of the carrier whilst the vector VR which is perpendicular to it, is representative of the sideband signal, the speech signal being represented by a first single sinusoidal signal. The modulation depth associated with this signal combination is represented by the angle α. Furthermore, this Figure show a vector representation of a second signal combination in which the vector PS is representative of the carrier signal and in which vector ST is representative of the sideband signal the speech signal being represented by a second single sinusoidal signal whose amplitude is larger than the amplitude of the first sinusoidal signal, which is evidenced by the larger depth of modulation represented in the Figure by the angle $\beta$.

The vectors PV and PS respectively are limited to the value PW by the limiter. As this Figure shows the vectors VR and ST are simultaneously limited to the values WR' and WT' respectively. Hence we have VP : WP = RV : R'W and SP : WP = TS : T'W. This means on the one hand that the reductions in the sideband signal levels are proportional to the reductions in the relevant carrier signal levels, which automatically effects the proper expansion and on the other hand that the angles $\alpha$ and $\beta$ which are representative of this modulation depth, are not affected by this expansion. It should be noted that the constant limiting level of FIG. 11, represented by curve 6, converts the quasi FM signal into a real FM signal.

To explain the proper expansion which is automatically obtained by means of the limiter, FIGS. 12a to 12d show the expanded output signal shapes which correspond to the limited input signal shapes shown in the FIGS. 10a to 10d.

These signals shown in the FIGS. 12a to 12d are demodulated with a carrier frequency corresponding to the centre frequency by means of the frequency discriminator 57 and are supplied to the reproducing device 59 after having been amplified and filtered in the amplifier 58.

It should be noted here that the signal transmission system according to the invention with quadrature-modulated signals to be transmitted is not limited to a receiver in which the filter 55 is constructed so that these QM modulated signals are converted into quasi FM modulated signals, but the QM modulated signal may be converted by the filter into any angle-modulated signal such as, for example, into a phase-modulated signal. Furthermore, the invention is not limited to a single filter for the conversion of QM modulated signals into quasi FM modulated signals but the filter 55, shown in FIG. 8 may be composed of several single filters. FIG. 13 shows the characteristic 62 of a filter composed of three single filters having the characteristics 63, 64 and 65 in which the damping in dB with respect to the tuning frequency has been plotted versus the frequency deviation. In this Figure characteristic 63 represents a first single filter having a tuning frequency which corresponds to the carrier signal frequency and which has a bandwidth of 60 Hz and a quality factor of 250, characteristic 64 represents a second single filter having a tuning frequency which is 75 Hz below the tuning frequency of the first filter and which also has a bandwidth 60 Hz, and characteristic 65 represents a third single filter having a tuning frequency which is 75Hz above the tuning frequency of the first filter and which also has a bandwidth of 60 Hz, in which the quality factors of the second and third filters are equal to one another and are equal to or larger than the quality factor of the first filter. The composite filter obtained in this way shows, from 300 Hz of the tuning frequency onwards an increase in attenuation of 6 dB per octave which is accurate within half a dB, as is shown by characteristic 62.

This composite filter has the advantage that signals having a frequency of 300 Hz are attenuated about 33 dB more, relative to the tuning frequency than signals at the tuning frequency. This means that a signal compression of 33 dB can be applied at the transmitting end, in contrast to a filter 55 applied in the receiver which has the characteristic as shown in FIG. 9b, and which allows a compression of 20 dB in the transmitter.

What is claimed is:

1. A transmitter comprising a dynamic compressor having a dynamic control device and a compression rectifier fed by the signals to be transmitted, a threshold device coupled between said rectifier and said control device, a carrier signal source which supplies a pilot signal, the signal to be transmitted and the pilot signal being supplied to the dynamic control device, the dynamic control device comprising an input circuit including an amplitude modulator coupled to said signal source, the signal to be transmitted being applied to said modulator for generating at an angle a double-sideband signal with suppressed carrier, said input circuit including a combination device means coupled to the modulator output and to said signal source for combining the double-sideband modulated signal said control device further comprises amplitude control means coupled to said combination and threshold devices and the pilot signal.

2. A transmitter as claimed in claim 1 wherein said amplitude control means comprises an adjustable attenuation network.

3. A transmitter as claimed in claim 2, wherein the transmitter comprises a 90° phase shifting network coupled between said source and said combination device by means of which the carrier signal supplied to the modulator and to the combination device shows a mutual phase difference of 90° for obtaining a quadrature-modulated output signal.

4. A transmitter as claimed in claim 3, wherein the signals to be transmitted are speech signals in a frequency band of 300 to 3400 Hz and further comprising a limiter receiving said speech signals and coupled to the dynamic compressor and having a control characteristic so that the level of the quadrature-modulated signal supplied to the adjustable attenuation network of the compressor is compressed to a level which is a given amount lower relative to the quadrature-modulated signal corresponding to the maximum input signal level, the level of the carrier signal which is supplied to the adjustable attenuation network corresponding to this level, the carrier signal being compressed in the compressor in accordance with the instantaneous degree of compression of the speech signal.

5. A transmitter as claimed in claim 4, wherein said given amount is 20 decibels.

* * * * *